United States Patent
Mandel et al.

(10) Patent No.: US 7,180,738 B2
(45) Date of Patent: Feb. 20, 2007

(54) COMMUNICATION CABINET AND A METHOD FOR DUST REMOVAL OF COMMUNICATIONS CABINET FILTERS

(75) Inventors: Joel Allen Mandel, Moshav Chemed (IL); Asher Vaknin, Avne-Hefets (IL)

(73) Assignee: Teledata Networks Limited, Herzlia (IL)

( * ) Notice: Subject to any disclaimer, the term of this patent is extended or adjusted under 35 U.S.C. 154(b) by 0 days.

(21) Appl. No.: 10/981,968

(22) Filed: Nov. 4, 2004

(65) Prior Publication Data

US 2006/0092609 A1    May 4, 2006

(51) Int. Cl.
*H05K 7/20* (2006.01)

(52) U.S. Cl. .................... 361/695; 361/692; 361/693; 361/694; 454/184

(58) Field of Classification Search ............... 361/687, 361/692–697, 714, 717, 721–727; 165/101, 165/185, 126, 127, 104.34; 174/15.1, 16.3, 174/35 R, 35 GC, 35 MS; 55/471, 508, 55/493, 385.2; 454/184; 312/223.2, 223.3; 62/407, 408
See application file for complete search history.

(56) References Cited

U.S. PATENT DOCUMENTS 5,168,171 A * 12/1992 Tracewell .................... 307/64

6,105,875 A * 8/2000 LaGrotta et al. .......... 236/44 A
6,319,114 B1 * 11/2001 Nair et al. ................. 454/184
6,552,900 B1 * 4/2003 Hoefer et al. .............. 361/695
6,876,304 B2 * 4/2005 Pedoeem et al. ........... 340/584
6,885,554 B1 * 4/2005 Reeck et al. ............... 361/695
2005/0061155 A1 * 3/2005 Franey ........................ 96/421
2005/0108996 A1 * 5/2005 Latham et al. ............. 55/385.2

FOREIGN PATENT DOCUMENTS

JP    359036518 A  *  2/1984
JP    07239390 A   *  9/1995

* cited by examiner

*Primary Examiner*—Michael Datskovskiy
(74) *Attorney, Agent, or Firm*—Sonnenschein Nath & Rosenthal LLP (57) ABSTRACT

A communication cabinet, that includes: at least one fan, adapted to rotate at a first direction during a first period and to rotate at a second opposing direction during a second period; a controller, adapted to control the at least one fan; and at least one filter positioned to prevent dust from entering the communication cabinet and to allow air to exit the communication cabinet such as to remove dust from the filter during the second period. A method for dust removal from a filter, the method includes: providing communication cabinet that comprises the filter, whereas the filter is positioned such as to prevent dust from entering the communication cabinet; rotating at least one fan at a first direction during a first period such as to cool at least one communication circuit installed within the communication cabinet; and rotating the at least one fan at a second opposing direction during a second period such as to remove dust from the at least one filter.

7 Claims, 7 Drawing Sheets

COMMUNICATION CABINET AND A METHOD FOR DUST REMOVAL OF COMMUNICATIONS CABINET FILTERS

FIELD OF THE INVENTION

The present invention relates to communication cabinets and to methods for dust removal of communication cabinet filters.

BACKGROUND OF THE INVENTION

Modern network may include a large amount of communication cabinets that are spread over large areas. In many cases the communication cabinets are located several miles from each other. The large amount of communication cabinets and the distances between these cabinets increases the cost of network maintenance.

It is known that heat buildup shortens the life of communication equipment. Dust and particles also can cause various malfunctions, especially when the communication cabinet is located in a humid environment. Dust can stick to communication equipment forming a layer that increases the heat buildup.

Various cooling techniques are known in the art. A first technique utilizes perforated communication cabin walls or doors as well as internally installed fans. This technique allows dust to enter the communication cabinet thus subjecting communication equipment within the communication cabinet to dust related failures.

In order to prevent dust and particles from entering the communication cabinets some communication cabinets are equipped with filters. Air passes though the filters, cools the interior of the communication cabinet and is forced out of the communication cabinet.

Gradually, these filters get filled with dust and over time allow diminishing amounts of air to enter the communication cabinet. As a result the communication equipment within the communication heats and malfunctions.

There is a need to provide a communication cabinet and a method for dust removal of communication cabinet filters.

SUMMARY OF THE PRESENT INVENTION

A communication cabinet, that includes: (i) at least one fan, adapted to rotate at a first direction during a first period and to rotate at a second opposing direction during a second period; (ii) a controller, adapted to control the at least one fan; and (iii) at least one filter positioned to substantially prevent dust from entering the communication cabinet during the first period and to allow air to exit the communication cabinet such as to remove dust from the filter during the second period.

A method for dust removal from one or more filters, the method includes: (i) providing a communication cabinet that include the one or more filters, whereas the one or more filters are positioned such as to substantially prevent dust from entering the communication cabinet; (ii) rotating at least one fan at a first direction during a first period such as to cool at least one communication circuit installed within the communication cabinet; and (ii) rotating the at least one fan at a second opposing direction during a second period such as to remove dust from the at least one filter.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
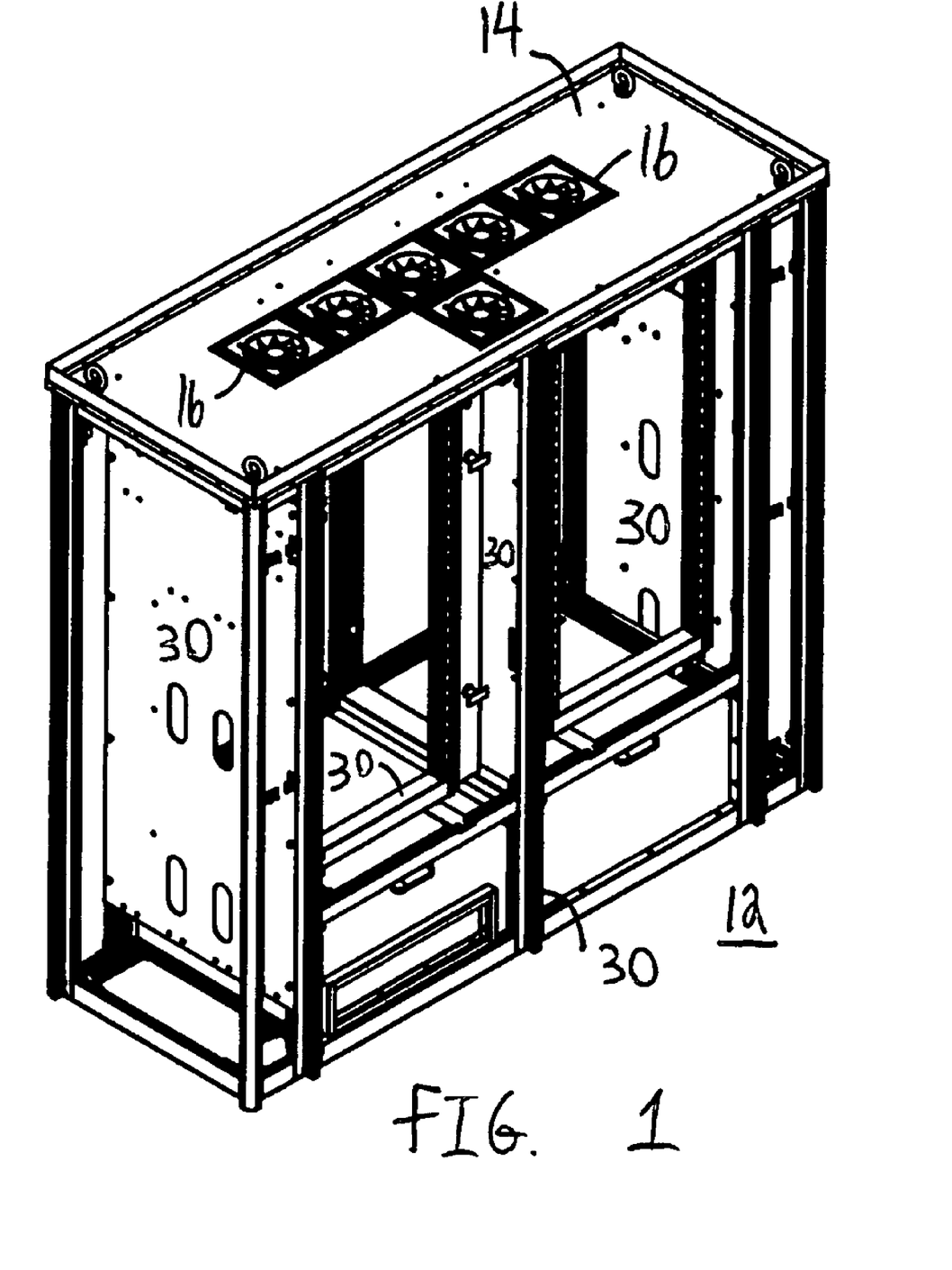
FIG. 1 illustrates a portion of a communication cabinet according to an embodiment of the invention.
Figure 2:
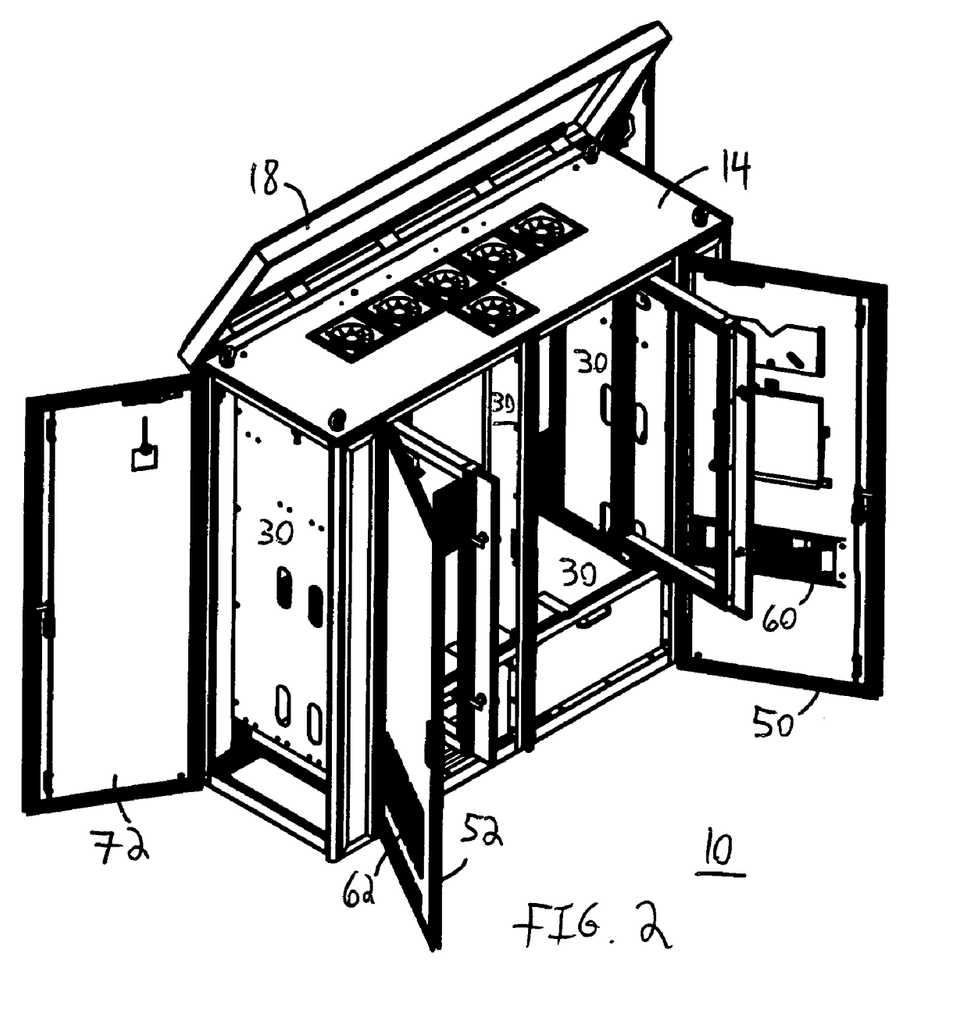
FIG. 2 illustrates a communication cabinet according to an embodiment of the invention.

FIG. 1 illustrates a portion 12 of communication cabinet 10 according to an embodiment of the invention. FIG. 1 illustrates the inner infrastructure of communication cabinet 10, without any doors, walls or any communication equipment. FIG. 2 illustrates portion 12 as well as multiple pivotally mounted doors and walls of the communication cabinet 10.

The inventors used a BroadAccess™ communication cabinet of Teledata networks of Herzliya, Israel. The BroadAccess™ includes a large variety of communication cabinets of different sizes that include one or more communication cages, and can support between sixty-four subscriber lines and one thousand and nine hundred subscriber lines. The communication cabinets can be installed outdoor or indoor, and can be mounted in various manners including wall mounting, pad mounting and floor level mounting. It is noted that the invention can be applied in other communication cabinets of the BroadAccess™ family, as well as in other communication cabinets.

The inner space of communication cabinet 10 is divided to multiple sections (denoted 40–48 in FIGS. 3 and 4) in a manner that allows air and cables to pass through theses sections, but this is not necessarily so. It is noted that at least one communication cage can be installed within each of these sections.

It is noted that communication cabinet 10 can include one or more fans that are positioned in various locations. For convenience of explanation it is assumed that multiple fans 16 are located in an upper inner wall 14 of the communication cabinet 10.

The amount of fans 16 and filters as well as their position can vary within the scope of the invention. For example, according to an embodiment of the invention fans are located in fan trays that are located under each communication cage. According to an embodiment of the invention these fans participate in the dust removal, but according to another embodiment they do not participate. These fans can rotate at the same direction, regardless of the rotation of fans 16, they can be shut down or slowed during the dust removal period or even can rotate at a first direction during cooling periods and rotate to an opposite direction during a dust removal period.

Portion 12 has a rectangular shape and includes an inner upper wall 14 in which six fans 16 are installed in a "T" formation. An upper section 48 is defined between inner upper wall 14 and the top wall (or cover) 18 of the communication cabinet 10. Conveniently, upper section 48 is designed such as to allow air sucked by fans 16 to exit the communication cabinet 10. The air can exit through apertures or openings defined by the top wall 18 and other parts of portion 12 such as the inner upper wall 14, by perforating portions of the top wall 18 or other parts of portion 12. According to an embodiment of the invention air can exit through at least one shutter.

A complex of rods, flanges and panels (denoted 30) divide the space between the inner upper wall 14 and the bottom wall 32 of the communication to four rectangular-shaped sections 40–46. Typically, communication equipment such as multiple communication boards are vertically positioned within dedicated rails that are connected to dedicated communication cages (not shown) that are installed within two upper sections 40 and 42. Typically, high power supply and additional circuitry are positioned in the lower sections 44 and 46.

Two sidewalls 70 and 72 are pivotally connected to portion 12. The pivotal connection eases the access to communication equipment while facilitating to install the communication cabinet 10 near a wall.

Two front doors 50 and 52 are pivotally connected to portion 12. Each door 50 and 52 has a single aperture within its lower portion. A first filter 60 is positioned within the aperture of first door 50 while a second filter 62 is positioned within the aperture of second door 52.

Conveniently, air can flow through the inner space of communication cabinet 10. During a first period (that can also be referred to as the cooling period) the fans 16 rotate such as to force air to enter the inner space through filters 60 and 62.

Figure 3:
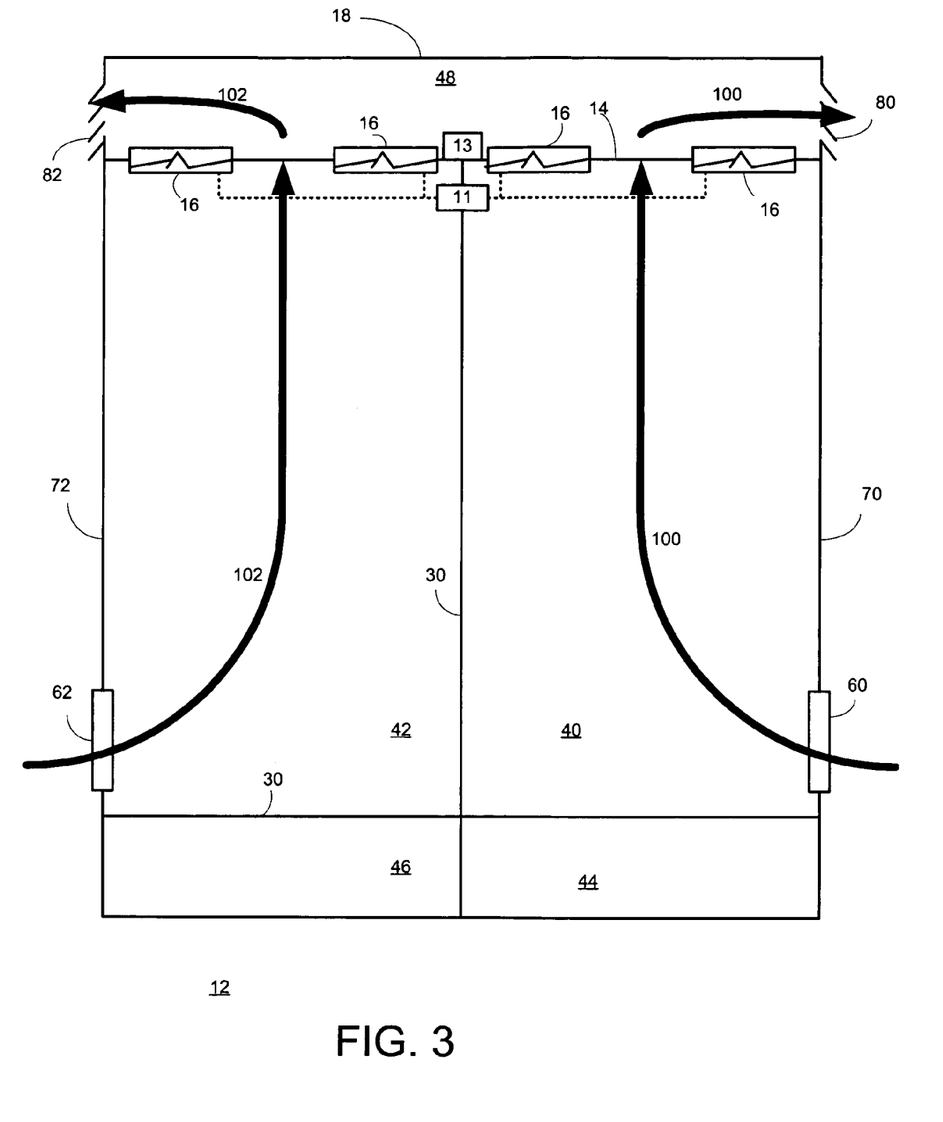
FIG. 3 is a schematic illustration of airflows within the communication cabinet during a cooling period, according to an embodiment of the invention.
Figure 4:
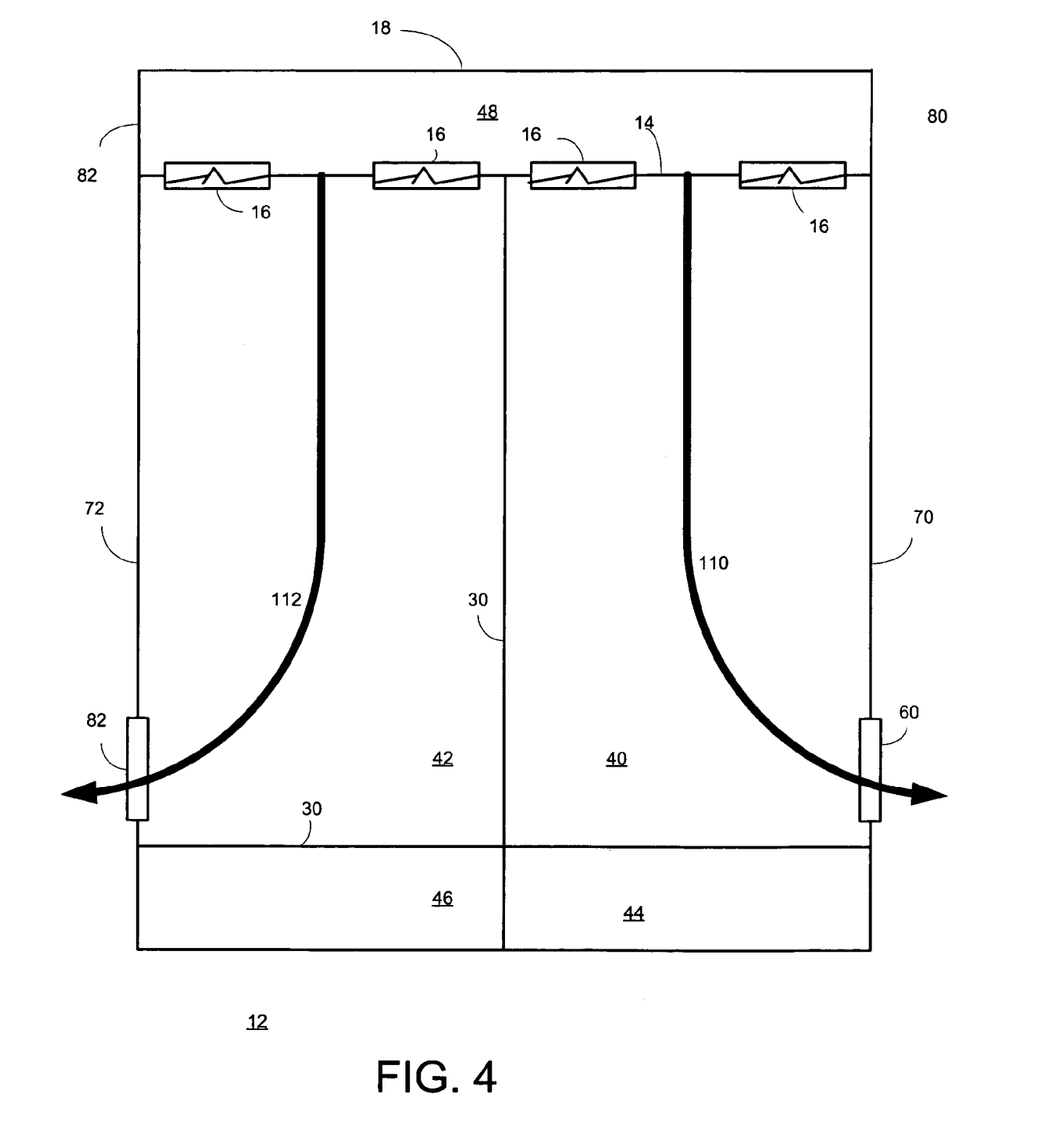
FIG. 4 is a schematic illustration of airflows within the communication cabinet during a dust removal period, according to an embodiment of the invention.

FIG. 3 is a schematic illustration of airflows 100 and 102 within the communication cabinet 10 during a cooling period and FIG. 4 is a schematic illustration of airflows 112 and 110 within the communication cabinet 10 during a dust removal period.

It is noted that both FIG. 3 and FIG. 4 are out of scale. It is further noted that these airflow illustrate the flow through an empty communication cabinet 10. One skilled in the art will appreciate that the airflows within the various sections of communication cabinet 10 shall vary when communication equipment is installed within the cabinet. It is further noted that the presence of communication equipment within the communication cabinet 10, the shape of the various sections (including the upper section 40) and the usage of multiple fans can alter the airflows (for example by inducing turbulences) but that air will substantially follow one or more path that starts at filters 60 and 62 and ends at shutters 80 and 82.

During a cooling period fans 16 rotate at clockwise direction and force air that enters through filters 60 and 62 to flow (as illustrated by airflows 100 and 102) through sections 40 and 42, through fans 16 and the upper section 48 and finally to exit the communication cabinet through shutters 80 and 82. Typically, during the cooling period the filters 60 and 62, and especially their outer surfaces, get filled with dust and particles.

During a dust removal period fans 16 rotate at counterclockwise direction and force air to flow (as illustrated by airflows 110 and 112) through sections 40 and 42 and to exit through filters 60 and 62. The air that exits through filters can remove the dust.

Conveniently, during the dust removal period air is not allowed to enter the communication cabinet 10, thus causing the communication equipment within the communication cabinet 10 to gradually heat. The shutters 80 and 82 are substantially closed during the duct removal period.

In order to prevent malfunctions, the dust removal period is relatively short. Its length can be determined by estimating the thermal behavior of the communication cabinet 10 and especially the behavior of communication circuitry within the cabinet 10. The dust removal period can also depend upon temperatures measured within one or more locations of the communication cabinet 10.

FIG. 3 further schematically illustrates a controller 13 that controls the rotation of fans 16. It is noted that the control 13 controls the polarity of power supplied to the fans by sending control signals to power supply 11. It is noted that various prior art methods and devices can be used for controlling the fans and that the controller 13 can be located within various locations of communication cabinet, including within a communication cage.

Figure 7:
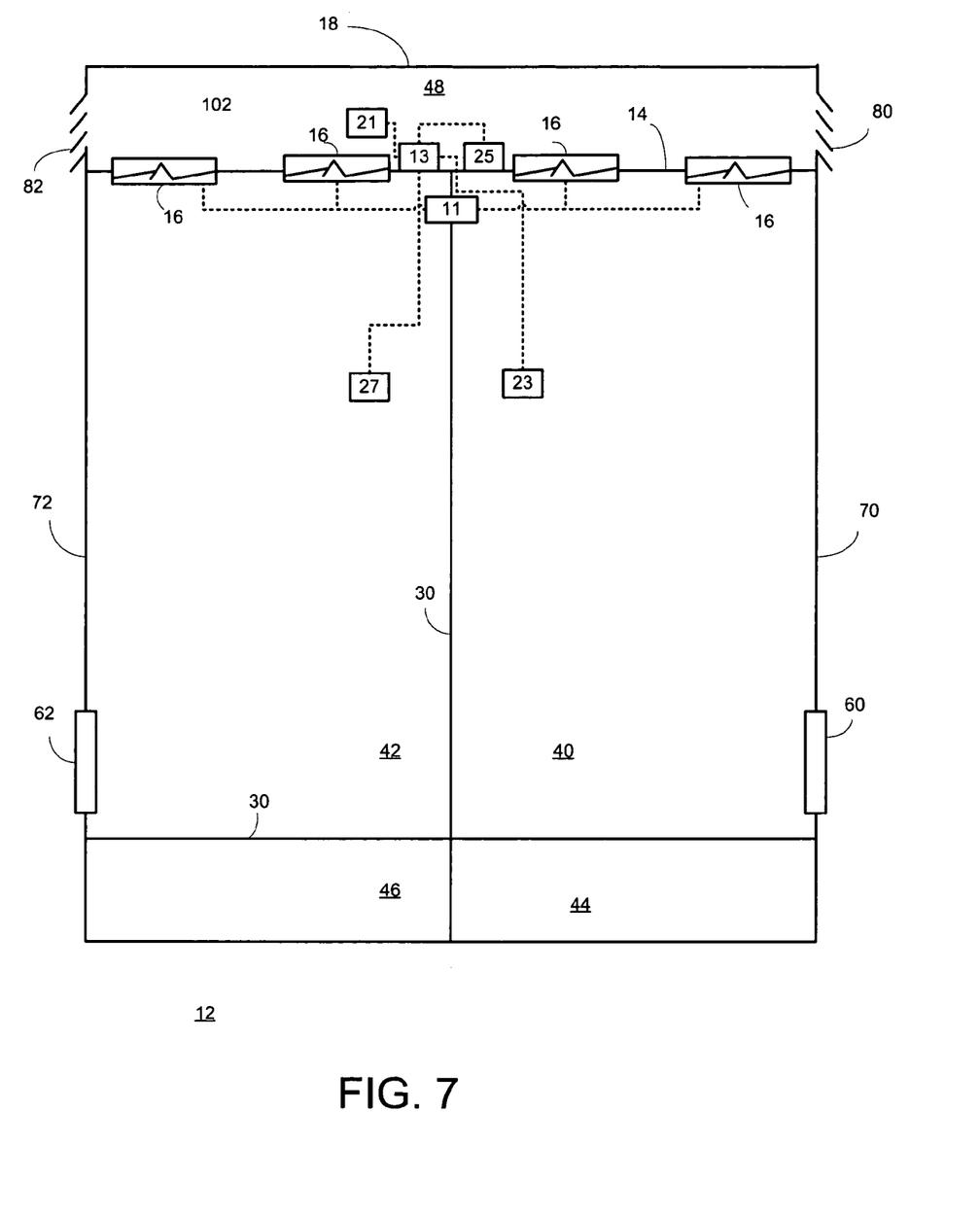
FIG. 7 is a schematic diagram of a controller, according to an embodiment of the invention.

FIG. 7 illustrates a controller 13, as well as various components of a fan control circuitry, according to an embodiment of the invention.

Controller 13 is connected to airflow sensor 21, temperature sensor 27, memory unit 25 and communication equipment controller 23. Controller 13 is also connected to power supply 11 and can control the polarity of voltage provided to fans. It is noted that other control signals and methods can be applied.

According to an embodiment of the invention the sequence of cooling period and dust removal period can be repeated continuously. Controller 13 sends appropriate control signals to fans 16 and in response they force air to exit filters 60 and 62 or to exit through shutters 80 and 82.

Conveniently, the controller 13 is connected to a pair of relays that can select between two power sources such as to reverse the polarity of voltage supplied to the fans.

According to another embodiment, controller 13 can initiate a dust removal session in response to signals provided to it by airflow sensor 21 or temperature sensor 27. It can initiate a dust removal period when the airflow reduces to a predefined threshold or once a heating pattern of the communication cabinet may indicate that one or more filters are partially filled with dust. The pattern can be stored within memory unit 25 and can even be updated by the controller 13.

The controller 13 can also initiate a dust removal period in response to the status of communication equipment, as indicated by communication equipment controller.

According to an embodiment of the invention the controller can shut down portions of the communication equipment when the temperature reaches a predetermined upper threshold.

According to another embodiment of the invention controller 13 can be connected a transmitter and report the status of the communication cabinet to a remote location. Thus, when failures occur or even when communication cabinet operates in a proper manner a remote location can receive status information.

Figure 5:
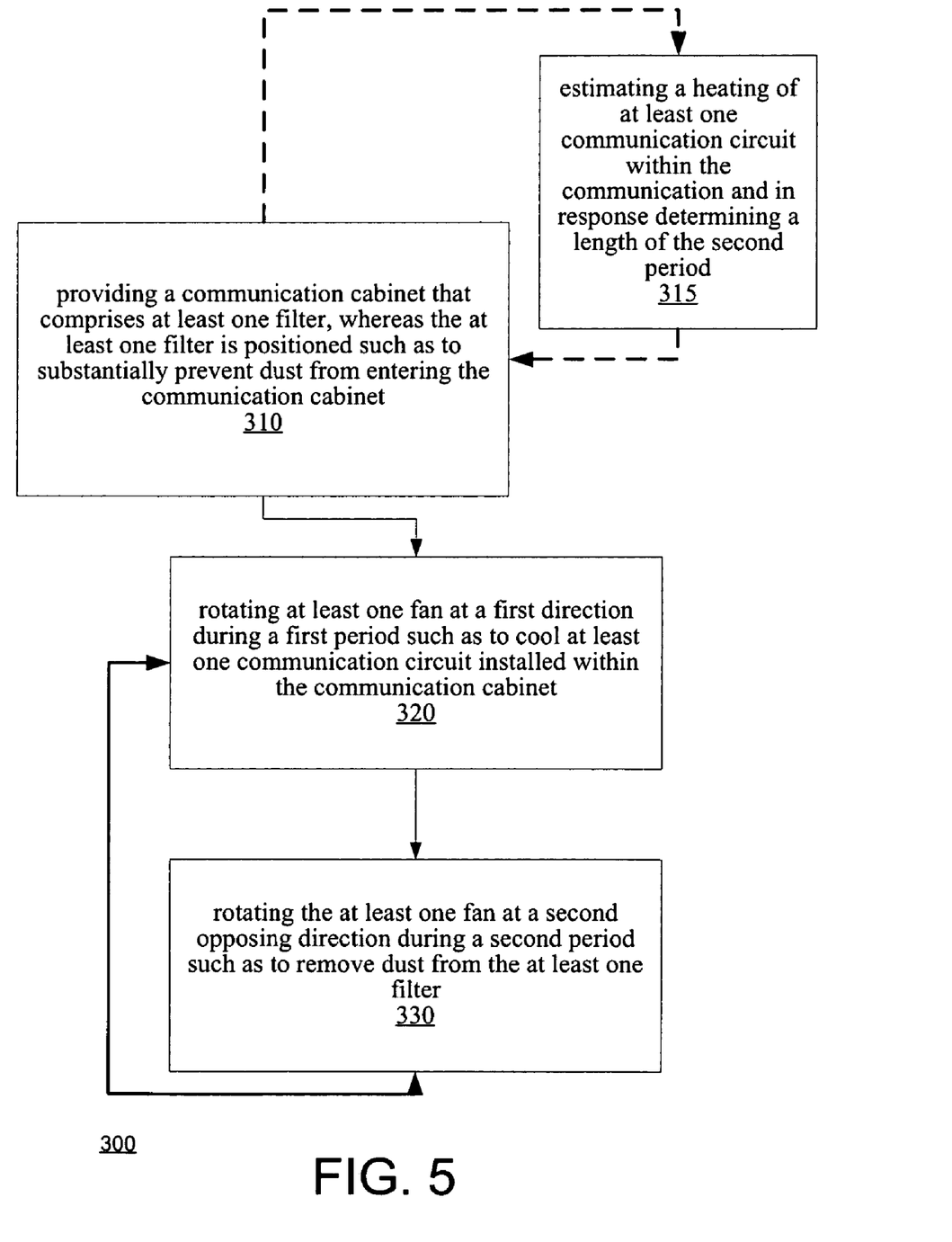
FIGS. 5–6 are flow charts illustrating methods for dust removal, according to embodiments of the invention.

FIG. 5 is a flow chart illustrating a method 300 for dust removal from a one or more filters. Method 300 starts by stage 310 of providing a communication cabinet that comprises at least one filter, whereas the at least one filter is positioned such as to substantially prevent dust from entering the communication cabinet.

Stage 310 is followed by stage 320 of rotating at least one fan at a first direction during a first period such as to cool at least one communication circuit installed within the communication cabinet. It is noted that the fans 16 of FIG. 1 rotate at the same direction but in other configurations during the cooling period one or more fans that belong to a first group of fans can rotate at a first direction while one or more fans that belong to a second group of fans rotate at a second opposing direction.

Stage 320 is followed by stage 330 of rotating the at least one fan at a second opposing direction during a second period such as to remove dust from the at least one filter. Stage 330 is followed by stage 320. It is noted that the fans 16 of FIG. 1 rotate at the same direction but in other configurations during the dust removal period one or more fans that belong to a first group of fans can rotate at the second direction while one or more fans that belong to a second group of fans rotate at the first direction.

According to an embodiment of the invention the first period is substantially longer than the second period. The inventors used a first period of about one hour or few hours and a second period of about one minute.

According to an embodiment of the invention method 300 further includes stage 315 of estimating a heating of at least one communication circuit within the communication and in response determining a length of the second period.

According to an embodiment of the invention stage 330 further includes receiving an indication about a temperature of at least one communication circuit within the communication period and in response adjusting the second period. Conveniently, the second period ends if the measured temperature reaches a predefined threshold. It is noted that the length of the second period can depend upon said measurement alone (for example—the rotation to the second opposing direction continues until the equipment reaches a certain temperature), or may be dependent upon said measurement and a predefined time period. The latter can include rotating at the second opposing direction until either a predetermined time passes or the measured temperature reaches the threshold.

According to an embodiment of the invention stage 320 of rotating of at least one fan during a first period includes forcing air from a low portion of the communication chamber to a high portion of the communication chamber.

According to yet a further embodiment of the invention stage 320 further includes allowing air to flow through at least one shutter and stage 330 include substantially preventing air from entering the communication cabinet via the at least one shutter.

According to various embodiments of the invention the length of each period and even the manner in which fans are activated (for example the amount of activated fans) and by dynamically altered, either in accordance to a predefined pattern or in response to signals provided to controller 13.

Figure 6:
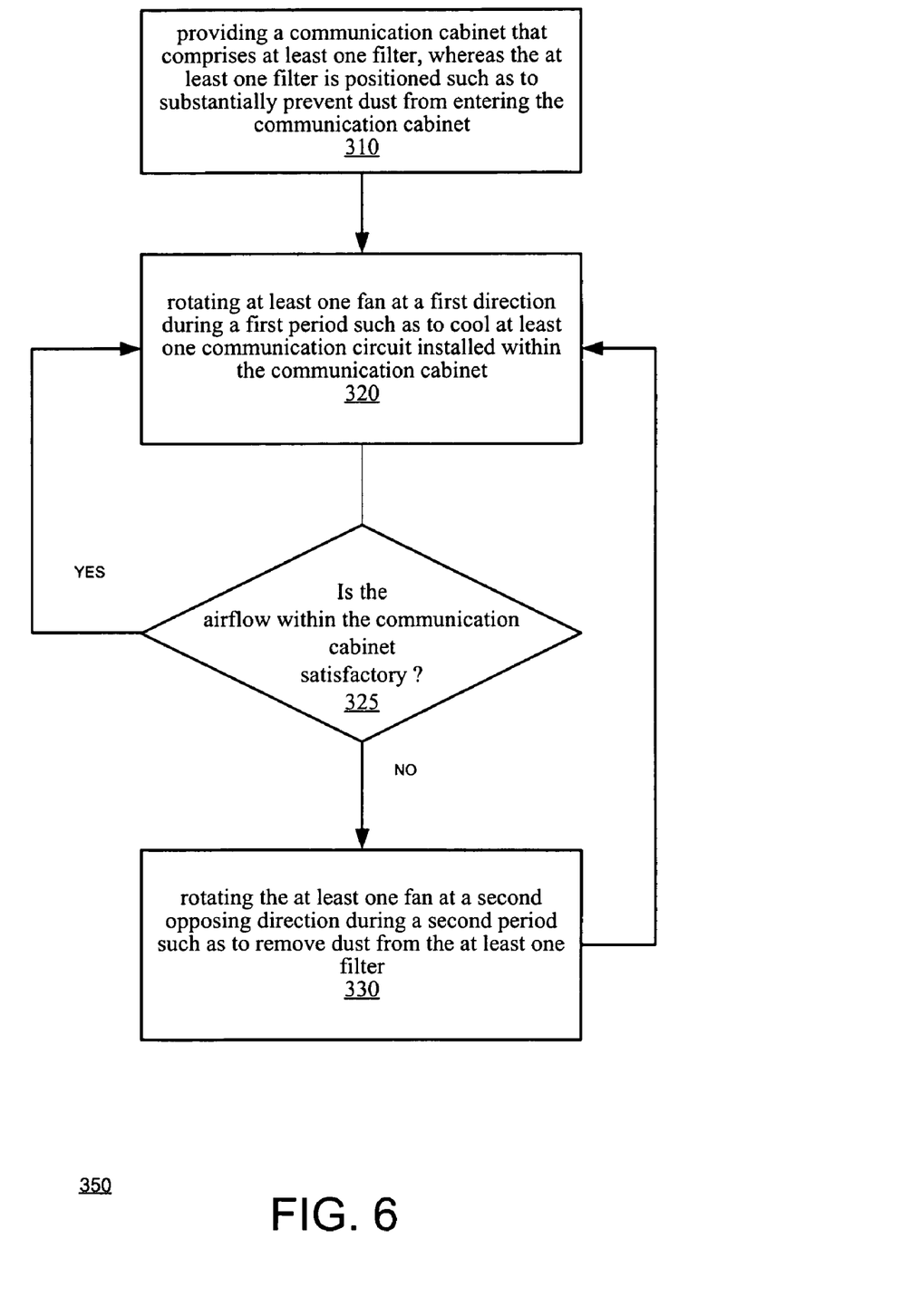

FIG. 6 is a flow chart illustrating a method 350 for dust removal from a filter. Method 350 differs from method 300 by stage 325 of checking if the airflow within the communication cabinet 10 is satisfactory. If so, stage 325 is followed by stage 320, else stage 325 is followed by stage 330. The airflow can be measured by flow meters but can also be estimated in response to the thermal behavior of the communication cabinet. For example if the communication cabinet reaches a certain temperature or tends to heat more quickly in comparison to an expected pattern than method 350 assumes that there is an airflow malfunction.

Those of skill in Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A communication cabinet, comprising:
   at least one fan, adapted to rotate at a first direction during a first period and to rotate at a second opposing direction during a second period;
   a controller, adapted to control the at least one fan; and
   at least one filter positioned to prevent dust from entering the communication cabinet during a first period and to allow air to exit the communication cabinet such as to remove dust from the filter during the second period, wherein a length of the second period is responsive to expected heating of at least one communication circuit within the communication cabinet during the second period.

2. A communication cabinet, comprising:
   at least one fan, adapted to rotate at a first direction during a first period and to rotate at a second opposing direction during a second period;
   a controller, adapted to control the at least one fan; and
   at least one filter positioned to prevent dust from entering the communication cabinet during a first period and to allow air to exit the communication cabinet such as to remove dust from the filter during the second period, whereas the controller is further adapted to receive an indication about a temperature of at least one communication circuit within the communication period and in response adjust the second period.

3. A communication cabinet, comprising:
   at least one fan, adapted to rotate at a first direction during a first period and to rotate at a second opposing direction during a second period;
   a controller, adapted to control the at least one fan; and
   at least one filter positioned to prevent dust from entering the communication cabinet during a first period and to allow air to exit the communication cabinet such as to remove dust from the filter during the second period, wherein the communication cabinet further comprises at least one shutter adapted to allow air to exit the communication cabinet during the first period and to substantially prevent air to enter the communication cabinet during the second period.

4. The communication cabinet of claim 3 whereas the at least one fan and the at least one shutter are positioned at a upper portion of the communication cabinet.

5. A method for dust removal from a filter, comprising:
   providing communication cabinet that comprises the filter, whereas the filter is positioned such as to prevent dust from entering the communication cabinet;
   rotating at least one fan at a first direction during a first period such as to cool at least one communication circuit installed within the communication cabinet;
   rotating the at least one fan at a second opposing direction during a second period such as to remove dust from the at least one filter, wherein the method further comprises estimating a heating of at least one communication circuit within the communication and in response determining a length of the second period.

6. A method for dust removal from a filter, comprising:
   providing communication cabinet that comprises the filter, whereas the filter is positioned such as to prevent dust from entering the communication cabinet;
   rotating at least one fan at a first direction during a first period such as to cool at least one communication circuit installed within the communication cabinet;
   rotating the at least one fan at a second opposing direction during a second period such as to remove dust from the at least one filter, wherein the method further comprises receiving an indication about a temperature of at least one communication circuit within the communication period and in response adjusting the second period.

7. A method for dust removal from a filter comprising:
   providing communication cabinet that comprises the filter, whereas the filter is positioned such as to prevent dust from entering the communication cabinet;

rotating at least one fan at a first direction during a first period such as to cool at least one communication circuit installed within the communication cabinet;

rotating the at least one fan at a second opposing direction during a second period such as to remove dust from the at least one filter, wherein the method further comprises allowing air to flow through at least one shutter during the first period and substantially prevent air from entering the communication cabinet during the second period.

* * * * *